US011085754B2

(12) United States Patent
Amit et al.

(10) Patent No.: US 11,085,754 B2
(45) Date of Patent: Aug. 10, 2021

(54) ENHANCING METROLOGY TARGET INFORMATION CONTENT

(71) Applicant: KLA-Tencor Corporation, Milpitas, CA (US)

(72) Inventors: Eran Amit, Haifa (IL); Amnon Manassen, Haifa (IL); Nadav Gutman, Zichron Ya'aqov (IL)

(73) Assignee: KLA Corporation, Milpitas, CA (US)

( * ) Notice: Subject to any disclaimer, the term of this patent is extended or adjusted under 35 U.S.C. 154(b) by 272 days.

(21) Appl. No.: 16/132,157

(22) Filed: Sep. 14, 2018

(65) Prior Publication Data
US 2019/0178630 A1   Jun. 13, 2019

Related U.S. Application Data

(60) Provisional application No. 62/597,900, filed on Dec. 12, 2017.

(51) Int. Cl.
| | | |
|---|---|---|
| *G01B 11/06* | (2006.01) | |
| *G06N 20/00* | (2019.01) | |
| *G03F 7/20* | (2006.01) | |
| *G01N 21/47* | (2006.01) | |

(52) U.S. Cl.
CPC .............. *G01B 11/06* (2013.01); *G01N 21/47* (2013.01); *G03F 7/70633* (2013.01); *G06N 20/00* (2019.01); *G01B 2210/56* (2013.01)

(58) Field of Classification Search
CPC .... G01B 11/06; G01B 2210/56; G01N 21/47; G03F 7/70633; G06N 20/00
See application file for complete search history.

(56) References Cited

U.S. PATENT DOCUMENTS

| | | |
|---|---|---|
| 7,068,833 B1 | 6/2006 | Ghinovker et al. |
| 7,671,990 B1 | 3/2010 | Adel et al. |
| 7,863,763 B2 | 1/2011 | Van Haren et al. |
| 8,913,237 B2 | 12/2014 | Levinski et al. |
| 9,709,903 B2 | 7/2017 | Choi et al. |
| 2008/0023855 A1* | 1/2008 | Ghinovker .......... G03F 7/70633 257/797 |

(Continued)

OTHER PUBLICATIONS

International Search Report and Written Opinion dated Jan. 16, 2019 for PCT/US2018/052333.

*Primary Examiner* — Catherine T. Rastovski
*Assistant Examiner* — Lyudmila Zaykova-Feldman
(74) *Attorney, Agent, or Firm* — Suiter Swantz pc llo

(57) ABSTRACT

Metrology targets designs, design methods and measurement methods are provided, which reduce noise and enhance measurement accuracy. Disclosed targets comprise an additional periodic structure which is orthogonal to the measurement direction along which given target structures are periodic. For example, in addition to two or more periodic structures along each measurement direction in imaging or scatterometry targets, a third, orthogonal periodic structure may be introduced, which provides additional information in the orthogonal direction, can be used to reduce noise, enhances accuracy and enables the application of machine learning algorithms to further enhance accuracy. Signals may be analyzed slice-wise with respect to the orthogonal periodic structure, which can be integrated in a process compatible manner in both imaging and scatterometry targets.

29 Claims, 13 Drawing Sheets

(56) References Cited

U.S. PATENT DOCUMENTS

| | | | |
|---|---|---|---|
| 2014/0065736 A1* | 3/2014 | Amir | G03F 7/70683 |
| | | | 438/14 |
| 2015/0177135 A1* | 6/2015 | Amit | G01N 21/4785 |
| | | | 702/150 |
| 2016/0047744 A1 | 2/2016 | Adel et al. | |
| 2016/0061589 A1* | 3/2016 | Bhattacharyya | G03F 7/70633 |
| | | | 356/620 |
| 2016/0216197 A1 | 7/2016 | Bringoltz et al. | |
| 2016/0266505 A1 | 9/2016 | Amit et al. | |
| 2016/0290796 A1 | 10/2016 | Levy et al. | |
| 2017/0146915 A1 | 5/2017 | Levinski et al. | |
| 2018/0188663 A1 | 7/2018 | Levinski et al. | |

\* cited by examiner

ENHANCING METROLOGY TARGET INFORMATION CONTENT

CROSS REFERENCE TO RELATED APPLICATIONS

This application claims the benefit of U.S. Provisional Patent Application No. 62/597,900 filed on Dec. 12, 2017, which is incorporated herein by reference in its entirety.

BACKGROUND OF THE INVENTION

1. Technical Field

The present invention relates to the field of semiconductor metrology, and more particularly, to target designs and measurement methods.

2. Discussion of Related Art

Semiconductor metrology includes several field imaging techniques such as optically based methods in either the field conjugate plane (e.g., imaging) or the pupil conjugate plane (e.g., scatterometry), as well scanning electron microscopy (SEM) methods. Traditionally, when designing targets for these metrologies the goal is to make the signal across the target uniform in order to average out noise during the measurement. In this method some information that can improve the metrology quality is filtered out.

It was suggested to use measurements of multiple targets and/or multiple measurement conditions on the same target to extract more information, for example in U.S. Pat. No. 8,913,237, incorporated herein by reference in its entirety. In U.S. patent application Ser. No. 15/442,111, incorporated herein by reference in its entirety, it was suggested to design patterns in lithography steps that do not have parameters of interest for the current metrology measurement, for example by modifying the phase of the light (which is known to have big influence in optical metrology). The suggested phase modulation was under the same uniformity constraint as discussed above.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology measurement method comprising measuring a metrology target, which comprises at least two periodic structures in at least one measurement direction—at an orthogonal direction with respect to a third periodic structure orthogonal to the respective measurement direction.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
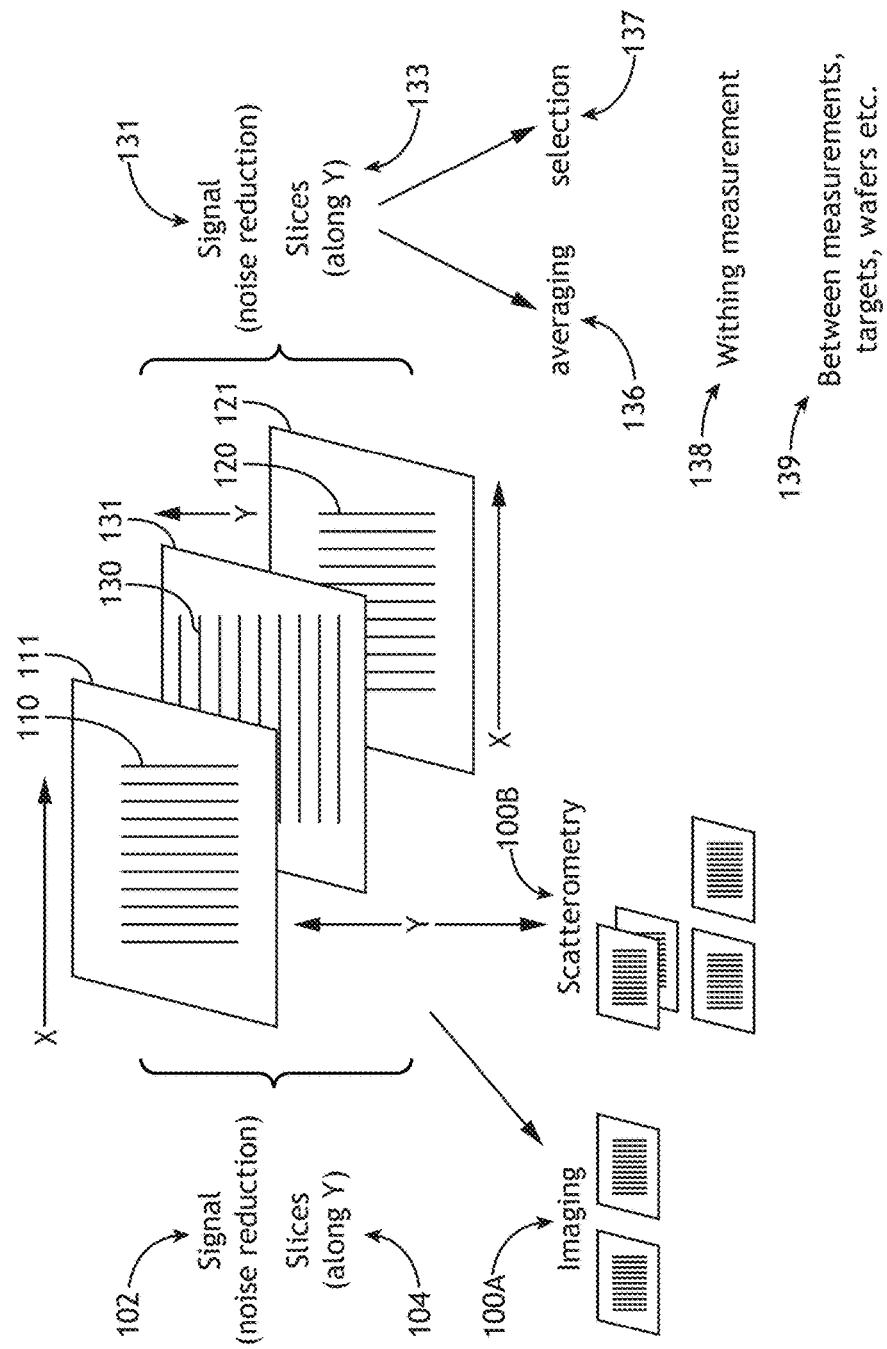
FIG. 1 is a high-level schematic illustration of metrology targets, signals derived therefrom and their uses, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Metrology targets designs, design methods and measurement methods are provided, which reduce noise and enhance measurement accuracy. Disclosed targets comprise an additional periodic structure which is orthogonal to the measurement direction along which given target structures are periodic. For example, in addition to two or more periodic structures along each measurement direction in imaging or scatterometry targets, a third, orthogonal periodic structure may be introduced, which provides additional information in the orthogonal direction, can be used to reduce noise, enhances accuracy and enables the application of machine learning algorithms to further enhance accuracy. Signals may be analyzed slice-wise with respect to the orthogonal periodic structure, which can be integrated in a process compatible manner in both imaging and scatterometry targets.

Advantageously, disclosed targets and methods overcome prior art metrology difficulties to break the correlation between grating asymmetry and overlay, which reduces accuracy. The induced designated spatial variations of the disclosed target designs help improve the noise filtering, and the additional information may be interpreted based on theoretical models to further improve the measurement accuracy and the process robustness.

FIG. 1 is a high-level schematic illustration of metrology targets 100, signals 102 derived therefrom and their uses, according to some embodiments of the invention. Targets uses are further described in method 200 illustrated in FIG. 7.

Metrology targets 100 may comprise, in addition to at least two periodic structures 110, 120 in at least one measurement direction (denoted "X" in FIG. 1), one or more third periodic structures 130 which are orthogonal (denoted "Y" in FIG. 1) to the respective measurement direction "X". In certain embodiments, periodic structure 130 may be set at an angle to measurement direction X, e.g., be oblique at an angle different from 90°, e.g., 45°, or possibly any of 10°, 20°, 30°, 50°, 60°, 70°, 80° or intermediate values with respect to measurement direction X. In certain embodiments, metrology targets 100 may be configured as imaging targets, e.g., having at least two pairs of periodic structures, at least one pair thereof along each of two measurement directions, and/or as scatterometry targets, e.g., having at least two pairs of periodic structures one above the other or side-by-side along each measurement direction, with periodic structures of each pair having opposite intentional offsets. Examples for imaging targets comprise AIM (advanced imaging metrology) targets, modified as disclosed herein by additional periodic structures 130. For example, AIM targets disclosed in U.S. Pat. Nos. 7,068,833 and 9,709,903, incorporated herein by reference in their entirety, may be modified as disclosed herein to yield examples of targets 100.

Signals 102 from one of periodic structures 110, 120 with respect to third periodic structure(s) 130, which may be derived with respect to the position of third periodic structure 130 in the layered stack and the order of layers 110, 120, 130—may be used to reduce noise associated with respective one of periodic structures 110, 120 and/or to improve the accuracy of metrology measurements concerning periodic structures 110, 120, as explained below, e.g., by enabling slice-wise analysis of signals 102 with respect to slices 104 defined by third periodic structure(s) 130. For example, signal components of slices 104 may be averaged 136 to reduce noise or improve accuracy (see also stage 230 of method 200, below), and/or signal components of slices 104 may be selected 137 for measurements, within a single measurement 138 and/or with respect to different measurements 139, e.g., relating to different targets, wafers, lots and/or batches—as explained in detail below.

Third periodic structure(s) 130 may be configured in various ways, e.g., have a single pitch and a single CD (critical dimension), have a variable CD, have a non-uniform spatial extent with respect to periodic structures 110, 120 and be positioned at one or more process layers, and involve one or more process steps, as shown below.

Disclosed target configurations may be applied to imaging targets 100A and/or to scatterometry targets 100B, in different configurations, such as with respect to periodic structures 110, 120 positioned side by side and/or periodic structures 110, 120 positioned at least partly on top of each other. The extent of third periodic structure(s) 130 may span one or both periodic structures 110, 120, and/or parts thereof.

In certain embodiments, disclosed targets 100 improve signal to noise ratio, metrology accuracy and/or metrology robustness to process variations, as disclosed below, and are applicable to optical imaging, optical scatterometry (using either field and pupil conjugate planes) and imaging using electron beam. Examples are provided for application in imaging and scatterometry metrology (in both field and pupil planes), as well as in electron beam imaging.

In certain embodiments, signal to noise ratio improvement may be achieved in the following way, using imaging metrology as a non-limiting example. The grating signal as a function of (field conjugate) location in imaging overlay targets comprising periodic structures 110, 120 in direction "X" may be approximated by Equation 1, with $S_0$ representing the periodic signal along the grating direction X, $S_0(x) = S_0(x+P)$, with P being the pitch of the periodic structures 110, 120, and f representing variations across the target.

$$S(x,y) = S_0(x) f(x,y) \qquad \text{Equation 1}$$

These variations denoted as f(x, y) in Equation 1 are considered as noise and therefore are, in the prior art, usually averaged out, for example by averaging the signal over in the y direction.

In certain embodiments, one or more additional ("third") periodic structure(s) 130 may be introduced in a separate lithography step to improve the signal to noise ratio by measuring one (or more) of layers 110, 120 with respect thereto. Additional ("third") periodic structure(s) 130 may be described using a function denoted by $\tilde{f}(x, y)$ which may be used for noise reduction purposes (e.g., in a noise reduction step of the metrology algorithm), e.g., by comparing or fitting the raw signal (described by Equation 1) to the known $\tilde{f}(x, y)$ and keeping only the portion of the signal that is described by it.

Figure 2:
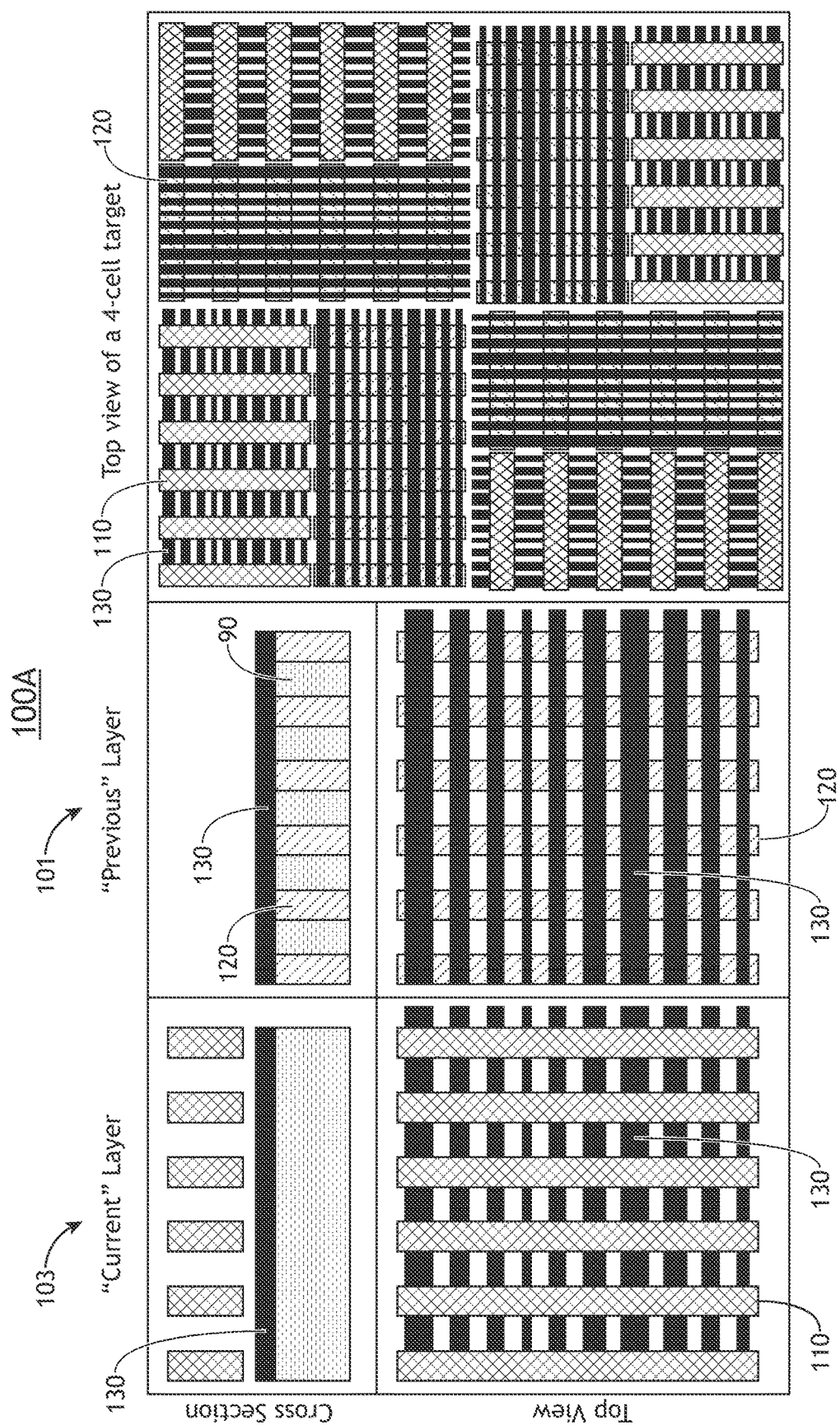
FIG. 2 is a high-level schematic illustration of an example for imaging metrology targets, according to some embodiments of the invention.

FIG. 2 is a high-level schematic illustration of an example for imaging metrology target 100A, according to some embodiments of the invention. FIG. 2 illustrates schematically side (cross section) and top views of targets layers 101 ("previous" target structure 120 within layer material 90) and 103 ("current") with introduced layer 130—in single target cells, as well as a top view of full target 100A, which includes four cells, two in each measurement direction. In the illustrated example, additional layer 130, characterized by $\tilde{f}(x, y)$, comprises a periodic structure along direction "Y" which is orthogonal to measurement direction "X" of periodic structures 110, 120. It is noted that in full target 100A, two cells have the measurement direction "X", while two other cells are used for measurements in the orthogonal direction (for which periodic structures 110, 120 are in measurement direction "Y" while additional periodic structure 130 is orthogonal thereto and is periodic in direction "X").

In certain embodiments, the signal processing may be carried out by fitting the signal in the orthogonal direction (e.g., "Y") for any given location $x_0$ to a Fourier series (or any other periodic function), and keeping only the modeled part, as expressed in Equation 2, with Py denoting the periodicity along the Y direction (of added periodic structure 130) and $a_n(x_0)$, $\varphi_n(x_0)$ denoted the fit parameters.

$$S(x_0, y) = \sum_{n=0}^{N} a_n(x_0) \cos\left(\frac{2\pi}{P_y} n y + \varphi_n(x_0)\right) \quad \text{Equation 2}$$

In certain embodiments, data processing may comprise averaging all the signal slices which have the same signal, as expressed in Equation 3, e.g., to simplify the noise averaging step by fitting the signal after the averaging, or by using the averaging itself to provide noise-reduction data.

$$\hat{S}(x_0, y) = \frac{1}{M} \sum_{m=0}^{M-1} S(x_0 + mP, y) \quad \text{Equation 3}$$

In certain embodiments, improved metrology accuracy may be achieved in the following way, using imaging metrology as a non-limiting example.

Figure 3A:
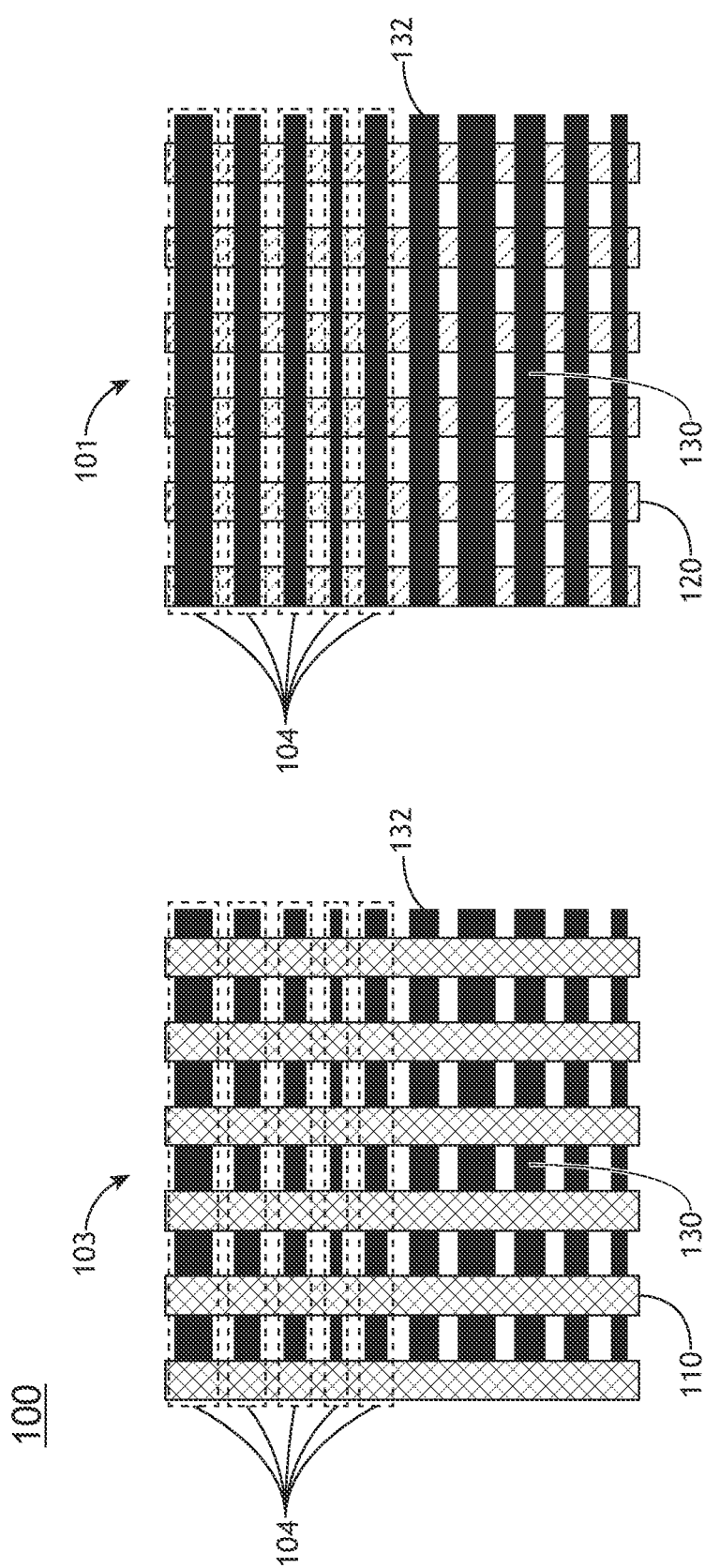
FIGS. 3A and 3B illustrate schematically the derivation of signal slices and provide a schematic example for adjusting measurements using the signal slices, according to some embodiments of the invention.
Figure 3B:
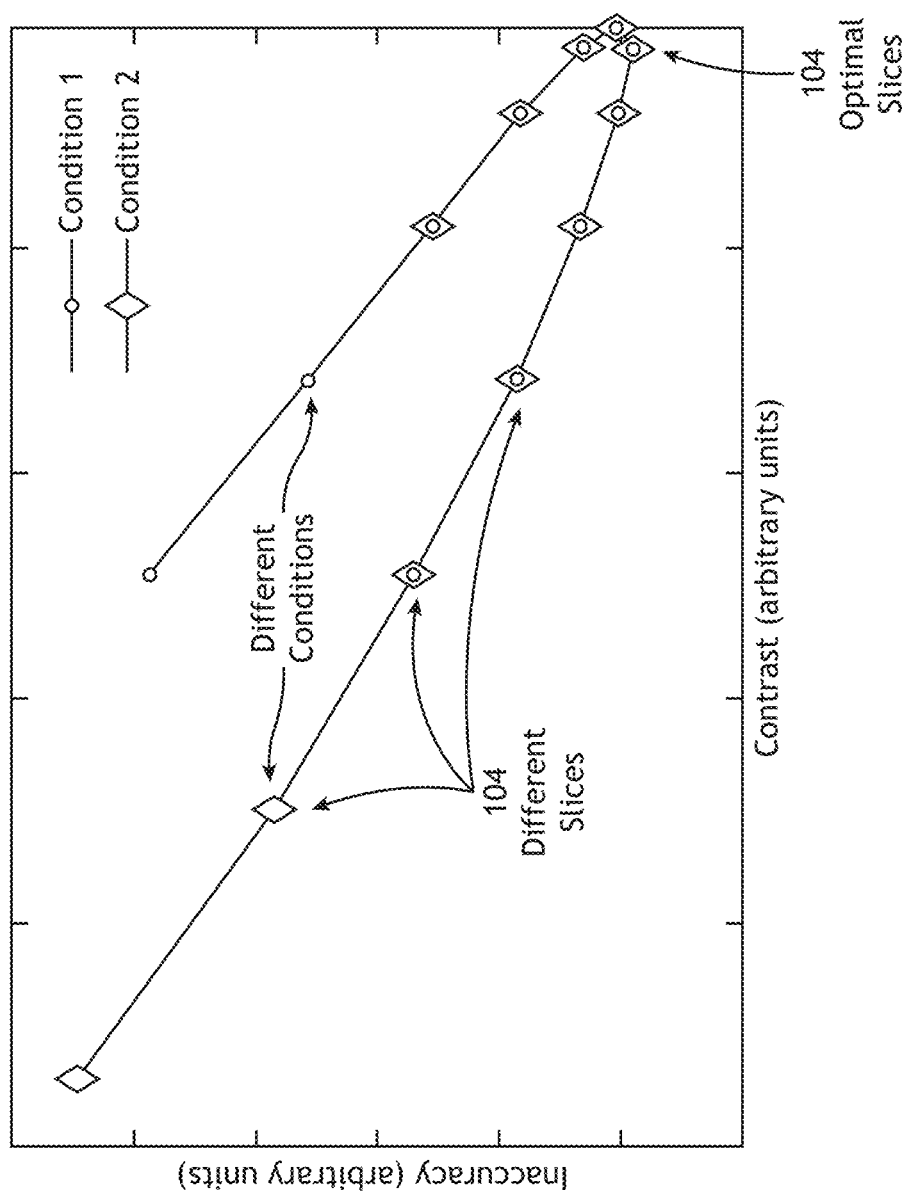

Additional ("third") periodic structure(s) 130 may further be used to enhance contrast and/or reduce inaccuracy by providing slices 104 of the signal, and applying corresponding computational techniques to the slices. FIGS. 3A and 3B illustrate schematically the derivation of signal slices 104 and provide a schematic example for adjusting measurements using signal slices 104, according to some embodiments of the invention. For example, slices 104 may be defined with respect to one or more elements 132 of periodic structure 130, e.g., include signal related to one or more elements 132, with or without parts of their surroundings, and with respect to either periodic structures 110, 120.

Due to the physics of the overlay measurements, the measurement properties such as contrast and inaccuracy depend on the exact combination of stack properties and measurement conditions. For example, in the presence of a single asymmetric source, the measured grating center may be expressed as in Equation 4, with the terms stack and measurement representing the specific stack parameters and measurement conditions, respectively; $\varepsilon$ denoting the geometrical center (neglecting geometrical ambiguity); $A_{Asy}$ denoting the asymmetry amplitude (for example—the side wall angle asymmetry, SWA, in degrees) and $\eta$ denoting the metrology response to this asymmetry under the specific measurement conditions and stack, which represents the induced inaccuracy, e.g., in nm/degree for the SWA example.

$$\text{Center(stack,measurement)} = \varepsilon + A_{Asy} \cdot \eta(\text{stack,measurement}) \quad \text{Equation 4}$$

Targets 100, having additional ("third") periodic structure(s) 130, may be divided into slices 104 with different y values (corresponding e.g., to elements of periodic structure(s) 130). The center of each slice 104 may be calculated independently as expressed in Equation 5, e.g., using Equation 4 and the expression for the signal from Equation 2 above for each slice 104 ($b_m(y)$, $\Phi_m(y)$ denoting the fit parameters).

$$\text{Center}(y) = \varepsilon + A_{Asy} \eta(y) \sum_{m=0}^{M} b_m(y) \cos\left(\frac{2\pi}{P_y} m y + \Phi_m(y)\right) \quad \text{Equation 5}$$

The inventors note that in symmetric targets (lacking asymmetry) the centers of different slices are equal, and in asymmetric targets (with some asymmetry) the induced variation in the slices may be proportional to the asymmetry amplitude. Moreover, since both the variations in the slice center (expressed by Equation 5) and the contrast (derived from Equation 3) depend on y—plotting $\varepsilon$ vs. I can provide information regarding the optimal accuracy, as demonstrated in FIG. 3B. FIG. 3B illustrates a schematic example for adjusting measurements using signal slices 104, the plot relates the inaccuracy in the geometrical center of slices 104 (Center(y)—$\varepsilon$), to the contrast, I, under two measurement conditions (e.g., different wavelengths, different wafers, different focus positions etc.). As illustrated schematically in FIG. 3B, different slices 104 vary in the quality of measurement derived from them, and it is possible to identify slices 104 which provide better measurements than others (e.g., slices 104 denoted as optimal, with minimal inaccuracy and maximal contrast), and hence to optimize measurements using slice selection. Either one or several slices 104 may be selected to provide the measurements. Moreover, the clear relation between inaccuracy and contrast further indicates that disclosed optimization is feasible under a range of measurement parameters, such as wavelengths, focus positions, wafers, etc.

For example, additional information may be extracted from the focus dependency or specific harmonic components of each of the measurement parameters. In the terminology of Equation 2, the harmonic components are provided by combinations of $\{a_n(x_0)\}$ and $\{\varphi_n(x_0)\}$. For example, focus may be calibrated using disclosed analysis of slice signals. The optimization, as illustrated in FIG. 3B may be multi-dimensional, e.g., in addition to the inaccuracy and contrast parameters, also focus or other parameters may be used to derive the dependency of slice-related measurements thereto.

In certain embodiments, machine learning algorithms may be applied to signals derived from targets 100 to utilize the additional information provided thereby with respect to prior art targets. Machine learning algorithms may be used to improve accuracy and/or reduce noise, e.g., averaging along the y axis to derive a two-dimensional signal (instead of prior art one dimensional kernel), on which various algorithmic approaches, such as PCA (Principal Component Analysis), Fourier analysis or other approaches may be applied—to derive a basis for analyzing future signals, for applying neural networks, linear regression or other techniques, for applying learning algorithms etc.

The inventors note that using periodic structure(s) 130 which are orthogonal to target periodic structures 110, 120 provides de-coupling of asymmetric process effects on periodic structure 130 from asymmetric process effects on periodic structures 110, 120, as illustrated in Equation 5.

In certain embodiments, the optimal slice may be derived, e.g., per target, die, wafer, lot or batch—e.g., to improve accuracy and/or to enhance the metrology robustness to process variations. The signals related to the different slices may be considered as perturbations with respect to the signal of the optimal slice, when the corresponding signals are close to the optimal signal but are slightly modified due to small variations in the stack properties. The optimal slice may be found or selected during the recipe setup with the nominal stack. During measurement of different wafers, the stack properties may change and affect the optimal slice position within the target, e.g., the new optimal slice may have a different y value with respect to periodic structure 130. This position change may be identified by studying the relation between the metrology properties of the optimal slice and the other slices. Since it is assumed that the variations are small, the new optimal slice may have similar metrology properties with respect to the other slices as demonstrated in FIG. 3B in the gradually changing contrast and inaccuracy of the slices' measurements, and as explained above. In certain embodiments, two or more multidimensional curves may be fitted or interpolated in order to avoid using value(s) from a single slice and thereby reducing the associated noise. In certain embodiments, further signal to noise ratio improvement may be achieved as disclosed below, using scatterometry metrology as a non-limiting example.

Figure 4:
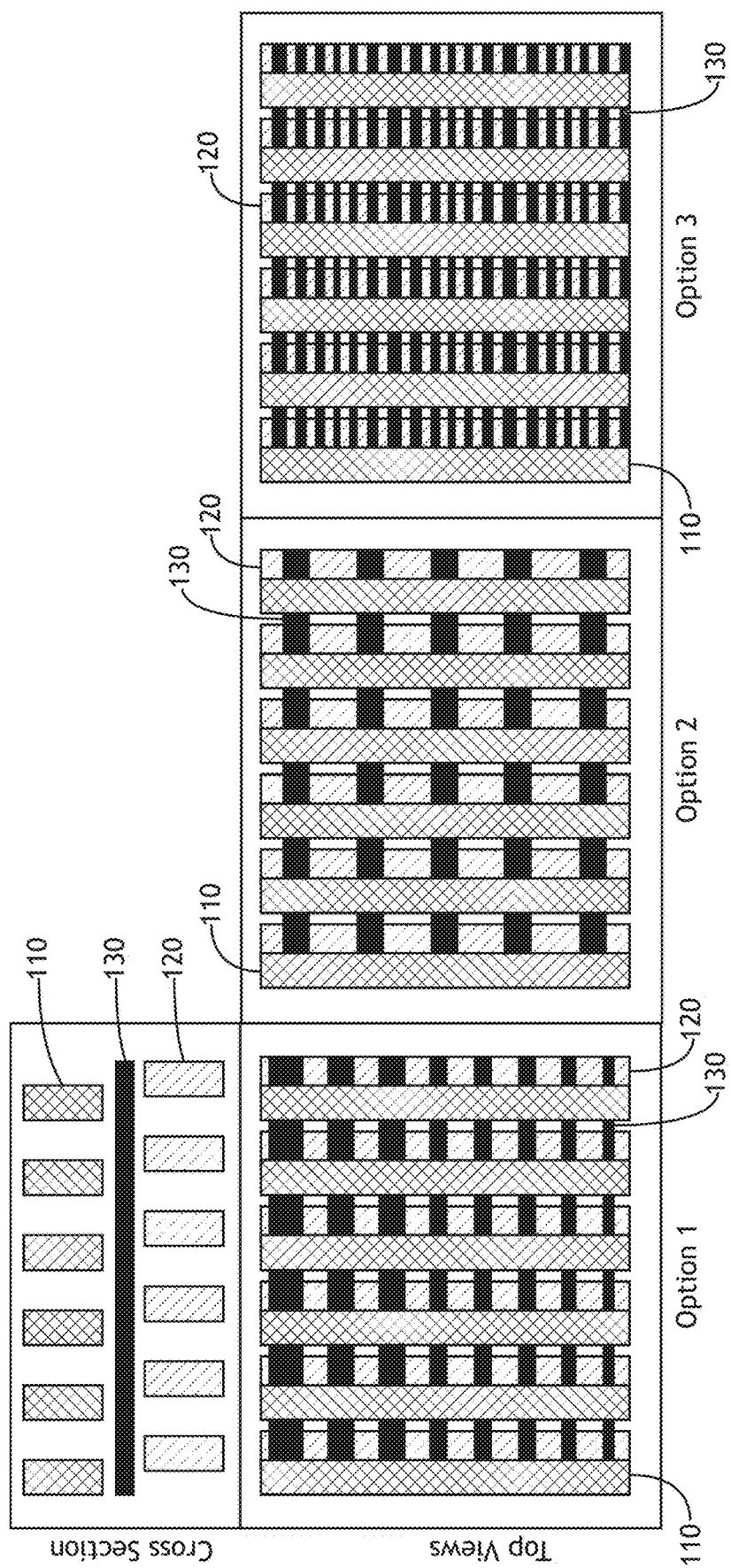
FIG. 4 is a high-level schematic illustration of examples for one cell of scatterometry metrology targets, according to some embodiments of the invention.
Figure 4:
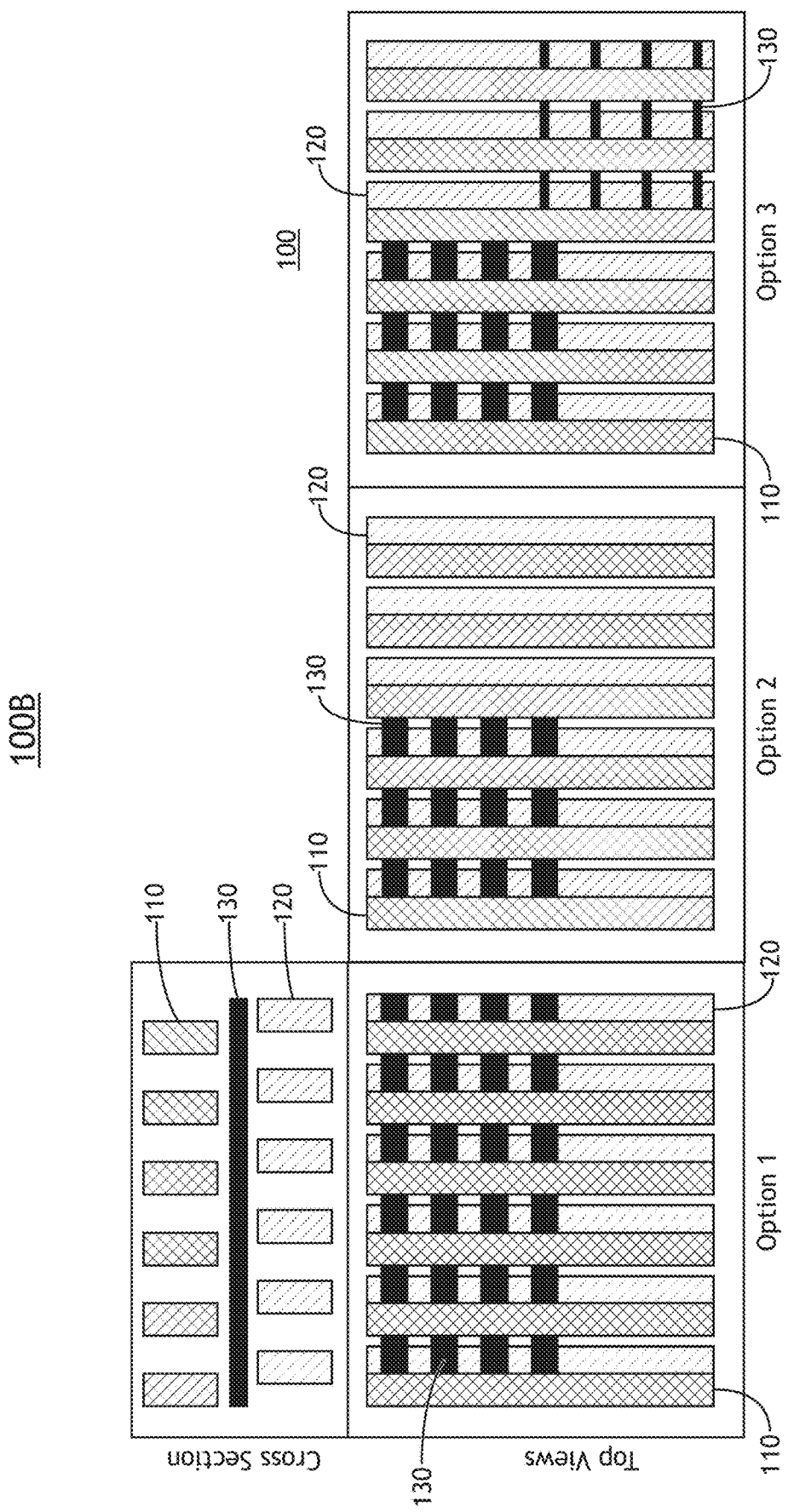

FIG. 4 is a high-level schematic illustration of examples for one cell of scatterometry metrology target 1008, according to some embodiments of the invention. The second cell of scatterometry metrology target 1008 may be designed similarly to the illustrated cell and have a different intended offset between the periodic structures (e.g., +f$_0$ and −f$_0$ for the two cells). FIG. 4 illustrates schematically side (cross section) and top views of the cell of target 100 having a grating-over-grating configuration of (parallel and overlapping) periodic structures 110, 120 and introduced additional layer 130, as well as top views of six options of full target design 1008, which differ in the arrangement of additional layer 130 in target 1008. Full target 1008 may comprise two cells with opposite offsets (see below) per measurement direction, and include one or two measurement directions with corresponding changes in the periodicity directions of structures 110, 120 and 130.

In certain embodiments of scatterometry, the collected signal in a field conjugate plane is composed of either the plus first or minus first diffraction order of radiation diffracted from target 100B. Metrology metrics, such as the overlay, may be calculated for each field location by pairing the signals with respective signals from the matched locations of the opposite order. The introduction of third, perpendicular, periodic structure 130 in target 100B causes modification of the raw diffracted signal (as the effective stack is modified), and can be described as expressed in Equation 6, with Δ denoting the x offset between the two parallel gratings (periodic structures 110, 120), $\tilde{I}_\pm(\Delta)$ denoting the average signal of the plus/minus first diffraction order, respectively, and f(y) describing the variance induced by the additional structure (periodic structure 130).

$$I_\pm(x,y;\Delta) = \hat{I}_\pm(\Delta)f(y) \quad \text{Equation 6}$$

For periodic structure 130, periodic with pitch $P_y$ along direction Y which is orthogonal to measurement direction X, the signal is periodic and may be expressed as in Equation 7.

$$f(y) = f(y + P_y) \quad \text{Equation 7}$$

The overlay, OVL, may be calculated using signal measurements of two target cells with induced offsets of corresponding target elements (e.g., grating bars) with respect to each other of $\pm f_0$. The OVL, marked by E, may be derived from Equation 8, for each pixel in the captured image, for example using linear approximation.

$$OVL(x,y) = f_0 \frac{I_+(x,y;\varepsilon+f_0) - I_-(x,y;\varepsilon+f_0) + I_+(x,y;\varepsilon-f_0) - I_-(x,y;\varepsilon-f_0)}{I_+(x,y;\varepsilon+f_0) - I_-(x,y;\varepsilon+f_0) - I_+(x,y;\varepsilon-f_0) + I_-(x,y;\varepsilon-f_0)} \quad \text{Equation 8}$$

Equation 9 illustrates the use of Equation 6 in Equation 8, where OVL does not depend on x coordinate, and Equation 10 provides a simplified expression of Equation 9.

$$OVL(x,y) = f_0 \frac{\hat{I}_+(\varepsilon+f_0)f(y) - \hat{I}_-(\varepsilon+f_0)f(y) + \hat{I}_+(\varepsilon-f_0)f(y) - \hat{I}_-(\varepsilon-f_0)f(y)}{\hat{I}_+(\varepsilon+f_0)f(y) - \hat{I}_-(\varepsilon+f_0)f(y) - \hat{I}_+(\varepsilon-f_0)f(y) + \hat{I}_-(\varepsilon-f_0)f(y)} \quad \text{Equation 9}$$

$$OVL(x,y) = f_0 \frac{\hat{I}_+(\varepsilon+f_0) - \hat{I}_-(\varepsilon+f_0) + \hat{I}_+(\varepsilon-f_0) - \hat{I}_-(\varepsilon-f_0)}{\hat{I}_+(\varepsilon+f_0) - \hat{I}_-(\varepsilon+f_0) - \hat{I}_+(\varepsilon-f_0) + \hat{I}_-(\varepsilon-f_0)} \quad \text{Equation 1}$$

Equation 10 illustrates that if the pixels are paired properly, the resulting OVL should not be affected by additional layer(s) 130 in the orthogonal direction, since each pair of pixels is normalized independently (just as different targets may have different raw signals).

The inventors further note that moreover, additional layer(s) 130 may be used to derive a new method for coordinates calibration (camera vs. beam axes). For example, various parameters relating to the optical paths in the metrology system may be derived from analyzing signals from periodic structure(s) 130, for example, filter size calibration may be carried out using these measurements to compensate for possible optical aberrations or periodic effects. Possibly, slice signal analysis may be applied for optical path calibration.

Returning to FIG. 4, a range of designs for additional "third" periodic structure 130 are presented in a non-limiting manner, such as monotonically changing CD (denoted as option 1), uniform CD (denoted as option 2), periodically changing CD (denoted as option 3), different spatial extents of any of these options, such as full extension in the X direction and partial extension in the Y direction (denoted as option 4), partial extension in both X and Y directions (denoted as option 5) and different CDs in different X and Y ranges (denoted as option 6)—or any combination of these options. Measurements and corresponding algorithms may be adapted according to the extension and parameters of periodic structure(s) 130. In certain embodiments, additional "third" periodic structure(s) 130 may be periodic in a direction which is not orthogonal to the measurement direction.

Figure 5:
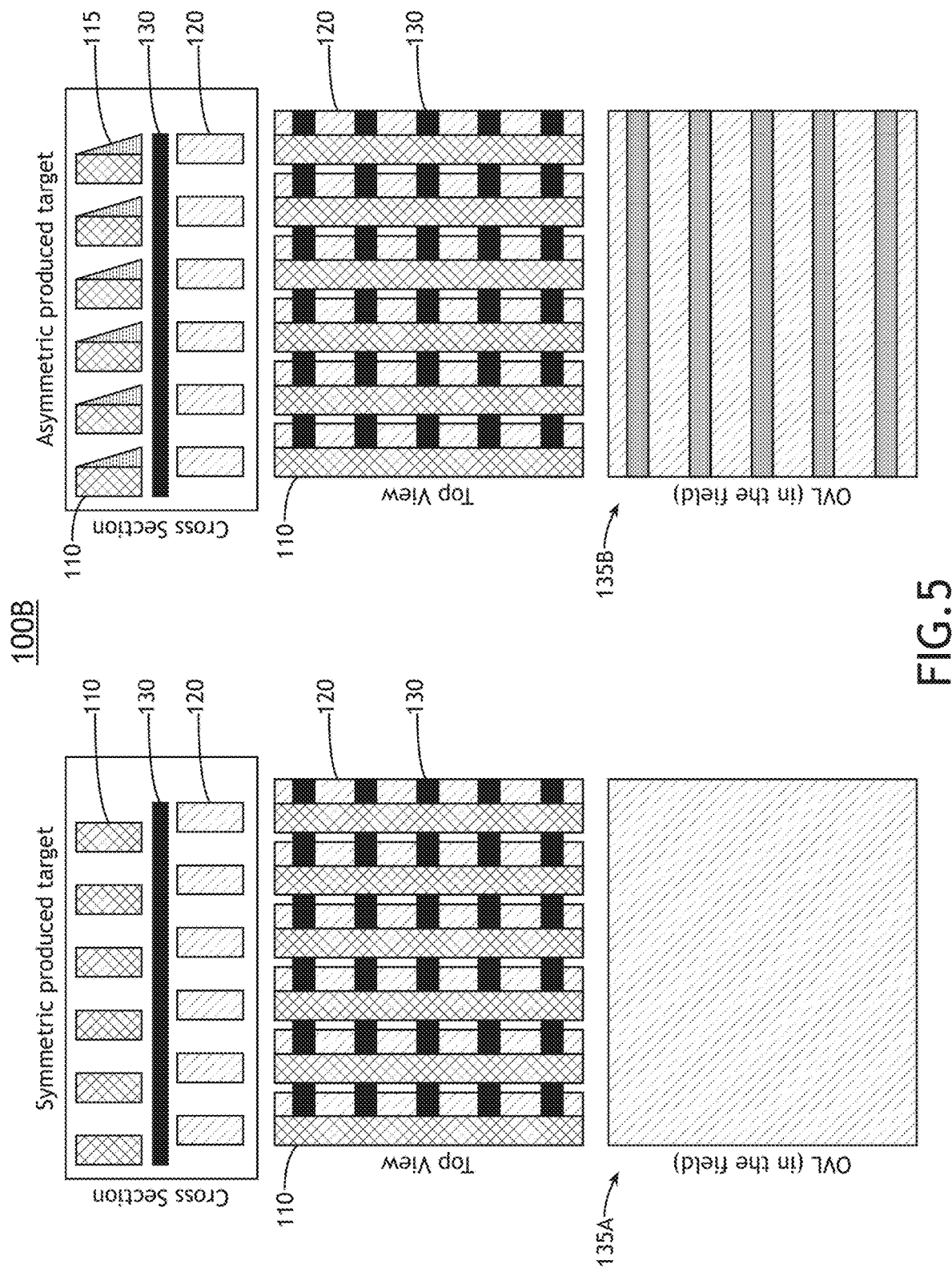
FIG. 5 is a high-level schematic illustration of symmetric and asymmetric scatterometry metrology targets, with corresponding signals, according to some embodiments of the invention.

FIG. 5 is a high-level schematic illustration of symmetric and asymmetric scatterometry metrology targets 100B, with corresponding signals, according to some embodiments of the invention. FIG. 5 provides side (cross section) views, top views and the field OVL signals corresponding to symmetric and asymmetric scatterometry targets 100B, the latter exhibiting SWA 115 as a non-limiting example for asymmetry. The signals correspond to Equation 10 for the symmetric case and to Equation 4 for the asymmetric case.

It is noted that Equation 10 holds for ideal symmetric targets 100B. In case asymmetries are present, as illustrated schematically in FIG. 5, the OVL (135B) has spatial dependencies (other than OVL 135A for symmetric target 100B), since the inaccuracy depends on the stack properties, as expressed in Equation 4. Accordingly, the methods to improve the signal to noise ratio, the measurement accuracy and the process robustness which were disclosed above concerning imaging targets 100A, are similarly applicable to scatterometry targets 100B.

In certain embodiments of scatterometry, the collected signal is in a pupil conjugate plane and the spatial information is convoluted. In certain embodiments, similar information as discussed above may be recovered by measuring the signal in several different locations within target 1008, and extracting the metrology metric (e.g., overlay) with enhanced accuracy from the multiple measurements. For example, in pupil scatterometry, multiple signals relating to one or more slice(s) 104 (or periodic structure 130) may be derived by carrying out multiple measurements of the wafer with respect to multiple locations at the field plane.

Alternatively or complementarily, information from orthogonal periodic structure 130 may be used as taught in U.S. patent application Ser. No. 15/159,009, incorporated herein by reference in its entirety. For example, single cell measurements taught by U.S. patent application Ser. No. 15/159,009 may be augmented by measurements from additional orthogonal periodic structure(s) 130 added to single cell designs described by U.S. patent application Ser. No. 15/159,009 (see e.g., paragraphs 148, 149 and 153-155 therein)—and these are likewise considered part of the current disclosure.

Figure 6:
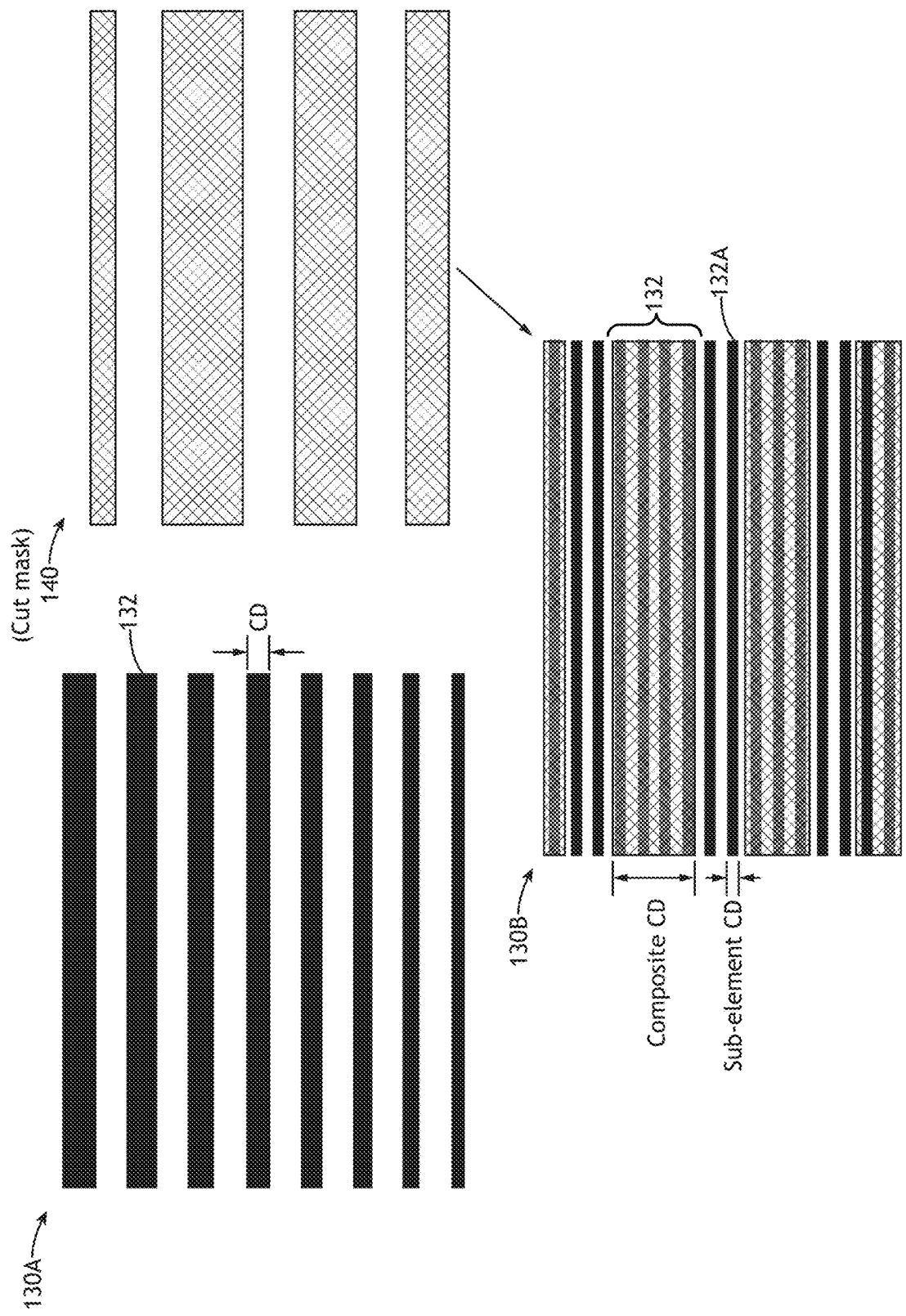
FIG. 6 is a high-level schematic illustration of process compatible designs for periodic structures of metrology targets, according to some embodiments of the invention.

In any of the disclosed embodiments, additional "third" periodic structure 130 may be produced in a process compatible manner. FIG. 6 is a high-level schematic illustration of process compatible designs for periodic structure 130 of metrology targets 100, according to some embodiments of the invention. For example, the duty cycle of periodic structure 130 may be adjusted by changing the CD of elements 132 of periodic structure 130 as illustrated in variation 130A, or the duty cycle of periodic structure 130 may be adjusted in a process-compatible manner by maintaining a uniform CD of sub-elements 132A and applying a cut mask 140 with varying cut CD to yield (composite) elements 132 of periodic structure 130, which have a variable composite CD (cCD), as illustrated in variation 130B. Sub-elements 132A may have smaller CD and smaller pitch than elements 132 illustrated in variation 130A, to render them process compatible. Segmentation to sub-elements 132A may be applied to any of the embodiments presented above. Disclosed designs may be applied, e.g., in electron beam imaging to enhance process compatibility of targets 100.

Advantageously, disclosed embodiments may use one or more additional lithography step(s) to generate structure(s) with known spatial variability. By fitting the measured signal to the known spatial signature, the metrology signal quality may be improved by removing noise that does not behave as the known structure; the metrology accuracy may be improved by using the spatial grating center and/or overlay distribution to remove inaccuracy; the measurement conditions may be optimized with respect to measurements of signals from periodic structures 130 and 110 and/or 120, as well as from measurements of periodic structure 130 by itself; process monitoring and metrology robustness may be enhanced. In certain embodiments, machine learning algorithms, which are enabled by the richer signal provided by using periodic structures 130 may be used to further enhance accuracy and robustness. Disclosed embodiments are applicable to optical imaging, optical scatterometry (using both field and pupil conjugate planes) as well as imaging using illumination radiation or particles (x ray, particle beams). Disclosed embodiments may be designed to be process compatible, e.g., using multiple lithography steps as disclosed above.

Figure 7:
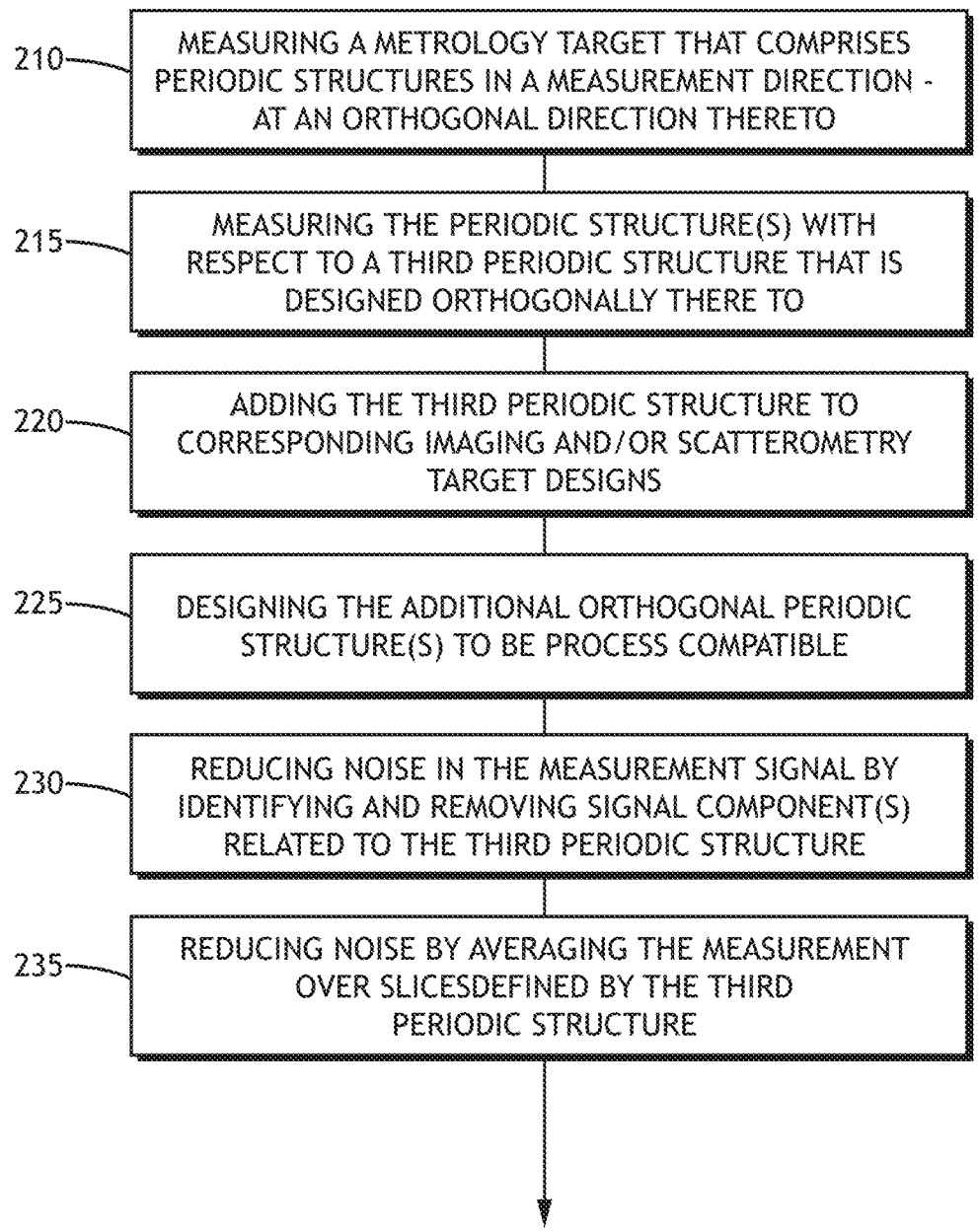
FIG. 7 is a high-level flowchart illustrating a method, according to some embodiments of the invention.
Figure 7:
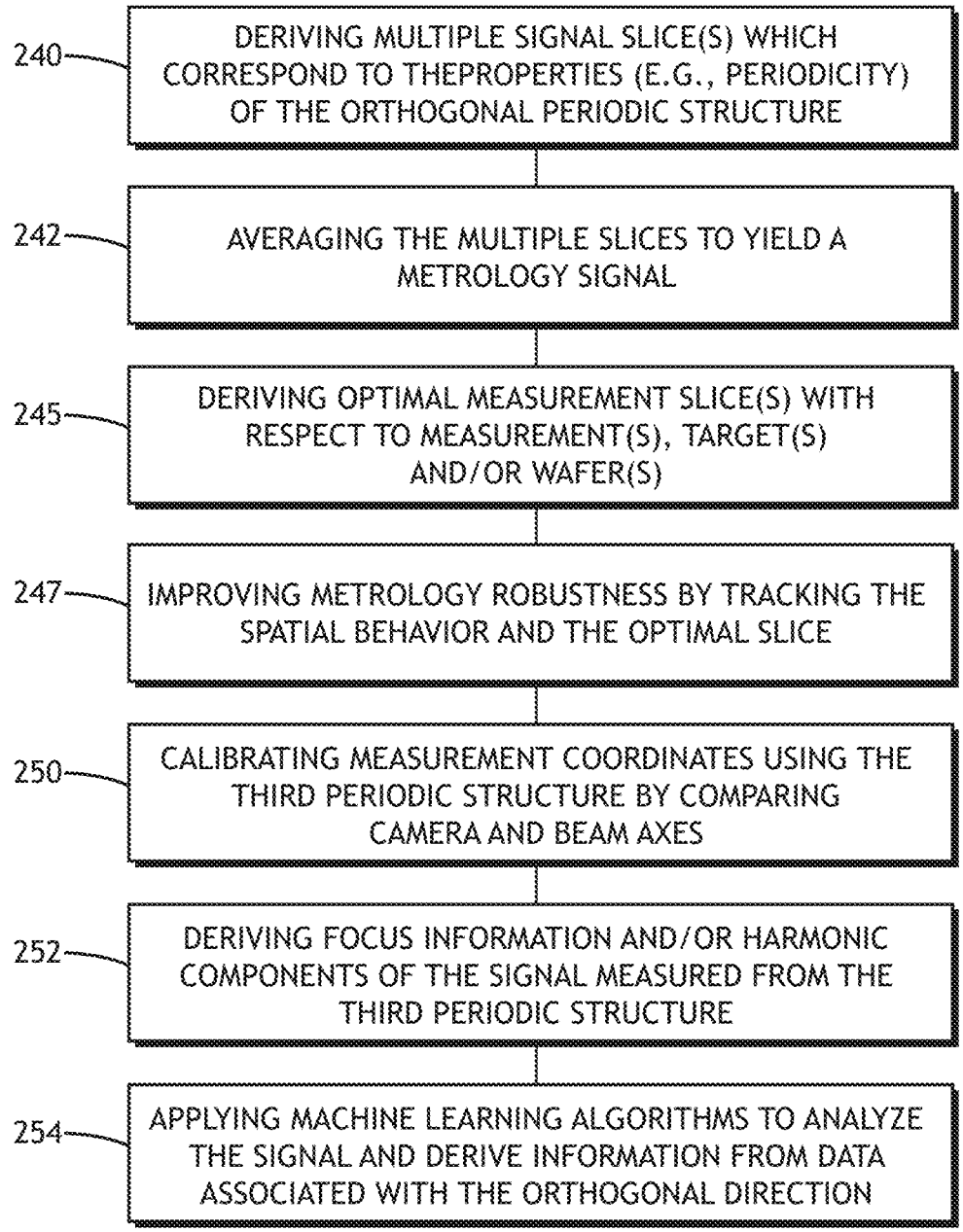

FIG. 7 is a high-level flowchart illustrating a method 200, according to some embodiments of the invention. The method stages may be carried out with respect to targets 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 may comprise a metrology measurement method comprising measuring a metrology target, which comprises at least two periodic structures in at least one measurement direction—at an orthogonal direction (stage 210) with respect to a third periodic structure orthogonal to the respective measurement direction (stage 215). Certain embodiments comprise metrology measurements derived by the metrology measurement method.

Method 200 may comprise a metrology target design method comprising adding an additional ("third") periodic structure into a target design comprising at least two periodic structures in at least one measurement direction, wherein the third periodic structure is orthogonal to the respective measurement direction (stage 220). The target design may be of an imaging target (e.g., AIM—advanced imaging metrology target) or of a scatterometry target, and method 200 may further comprise designing the third periodic structure to comprise at least one of: a uniform CD (critical dimension), a monotonic changing CD, a periodically monotonic changing CD, and two or more periodic sub-structures, as disclosed above. In certain embodiments, the third periodic structure may be periodic in a direction which is not orthogonal (e.g., oblique) to the measurement direction. Method 200 may further comprise designing the third periodic structure to be process compatible (stage 225), e.g., using at least one of: segmentation of elements of the third periodic structure, uniform CD of segments of elements of the third periodic structure, application of a cut mask with uniform or variable CD—as disclosed above. Certain embodiments comprise target design files of targets designed according to the metrology target design method as well as metrology measurements of targets designed according to the metrology target design method.

Method 200 may further comprise reducing noise in a signal derived by measuring 210, 215—by identifying and removing a signal component related to the third periodic structure (stage 230), e.g., by averaging the measurement over slices defined by the third periodic structure (stage 235), e.g., using Equation 3.

Method 200 may further comprise deriving multiple slices from a signal derived by the measuring, the slices corresponding to properties (e.g., a periodicity) of the third, orthogonal periodic structure (stage 240), e.g., using Equation 5. Method 200 may further comprise averaging the multiple slices to yield a metrology signal (stage 242). In certain embodiments, method 200 may further comprise selecting an optimal slice signal by comparing the multiple slices with respect to at least one accuracy parameter and possibly reiterating the selection for consecutive targets, wafers and/or batches (stage 245) and/or improving metrology robustness by tracking the spatial behavior and the optimal slice (stage 247).

Method 200 may further comprise calibrating measurement coordinates using the third periodic structure by comparing camera and beam axes (stage 250).

Method 200 may further comprise deriving focus information and/or harmonic components of a signal measured from the third periodic structure (stage 252).

Method 200 may further comprise applying machine learning algorithms to analyze a signal measured from the third periodic structure and derive information from data associated with the orthogonal direction (stage 254).

Method 200 may be applied to imaging or scatterometry metrology and targets. When applied to imaging metrology and targets, method 200 may further comprise using Equation 2 to derive at least one metrology metric from the measurement. When applied to field plane scatterometry metrology and targets, method 200 may further comprise using Equation 10 to derive at least one metrology metric from the measurement. When applied to pupil plane scatterometry metrology and targets, method 200 may further comprise carrying out the measuring in several different locations within the target and extracting a metrology metric with enhanced accuracy from the multiple measurements.

The additional orthogonal ("third") periodic structure may comprise at least one of: a uniform CD (critical dimension), a monotonic changing CD, a periodically monotonic changing CD, and two or more periodic sub-structures.

Figure 8A:
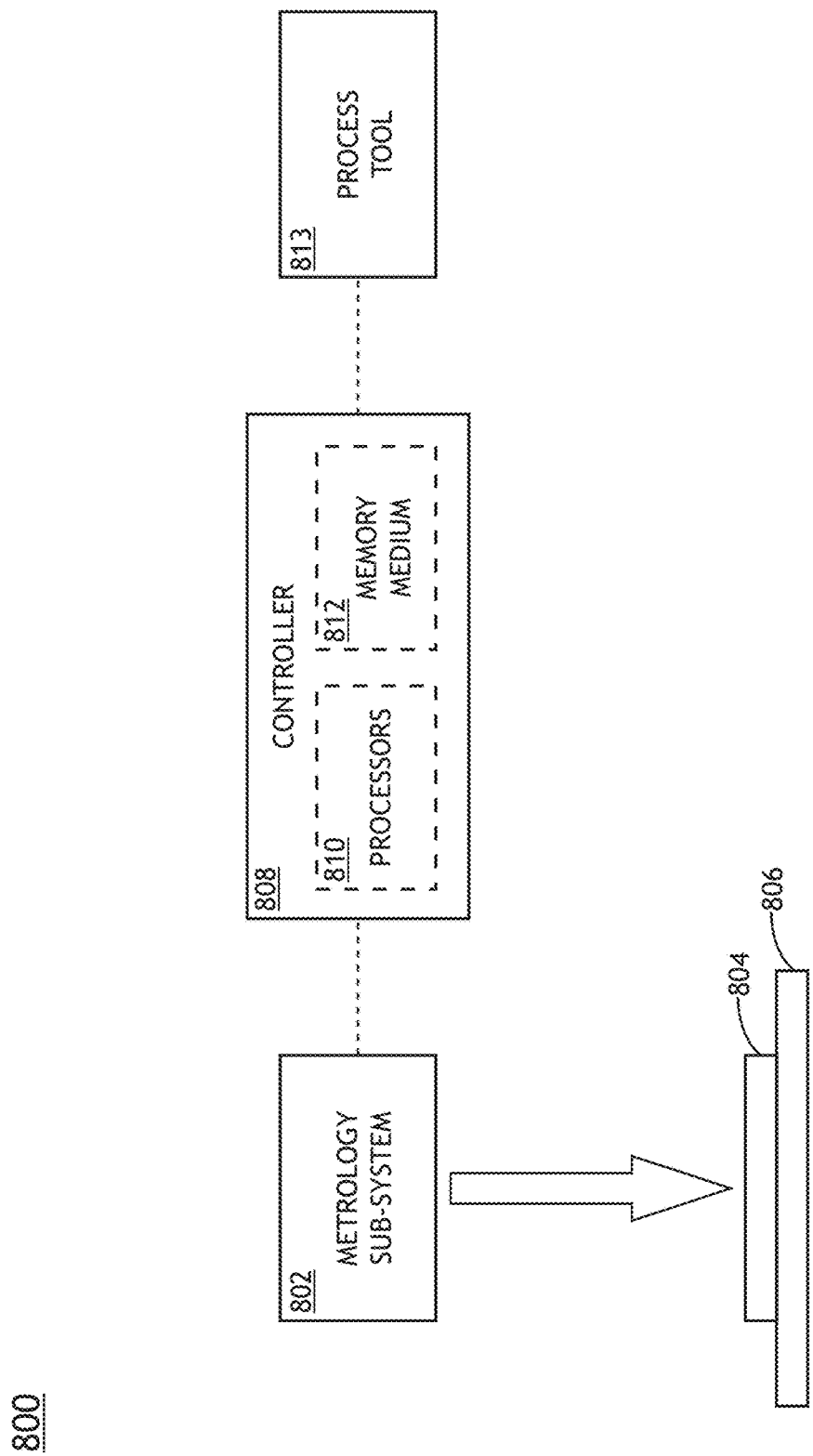
FIG. 8A illustrates a high-level schematic illustration of a metrology system, according to some embodiments of the invention.
Figure 8B:
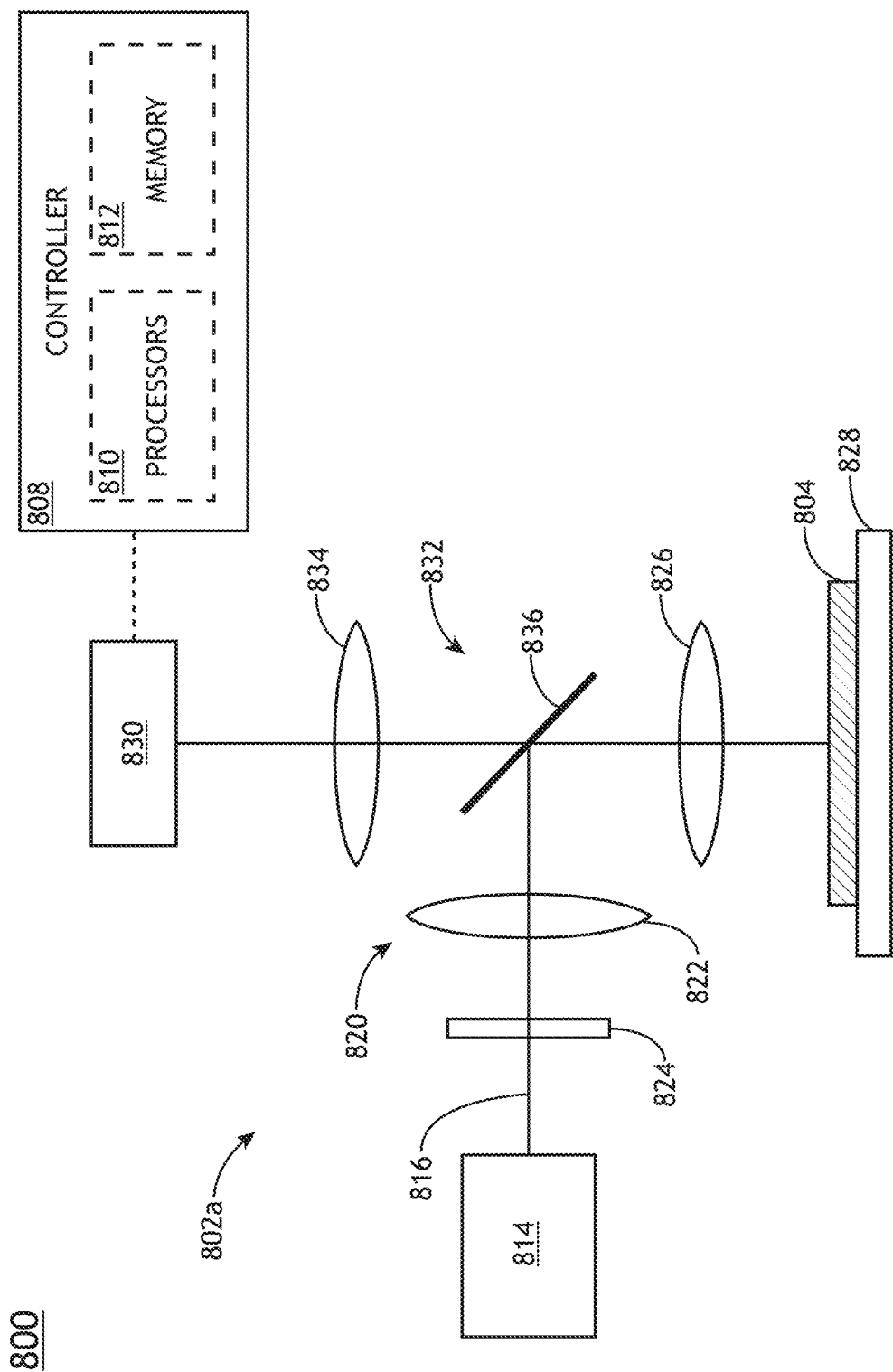
FIG. 8B illustrates a high-level schematic illustration of an optical metrology sub-system of the metrology system, according to some embodiments of the invention.
Figure 8C:
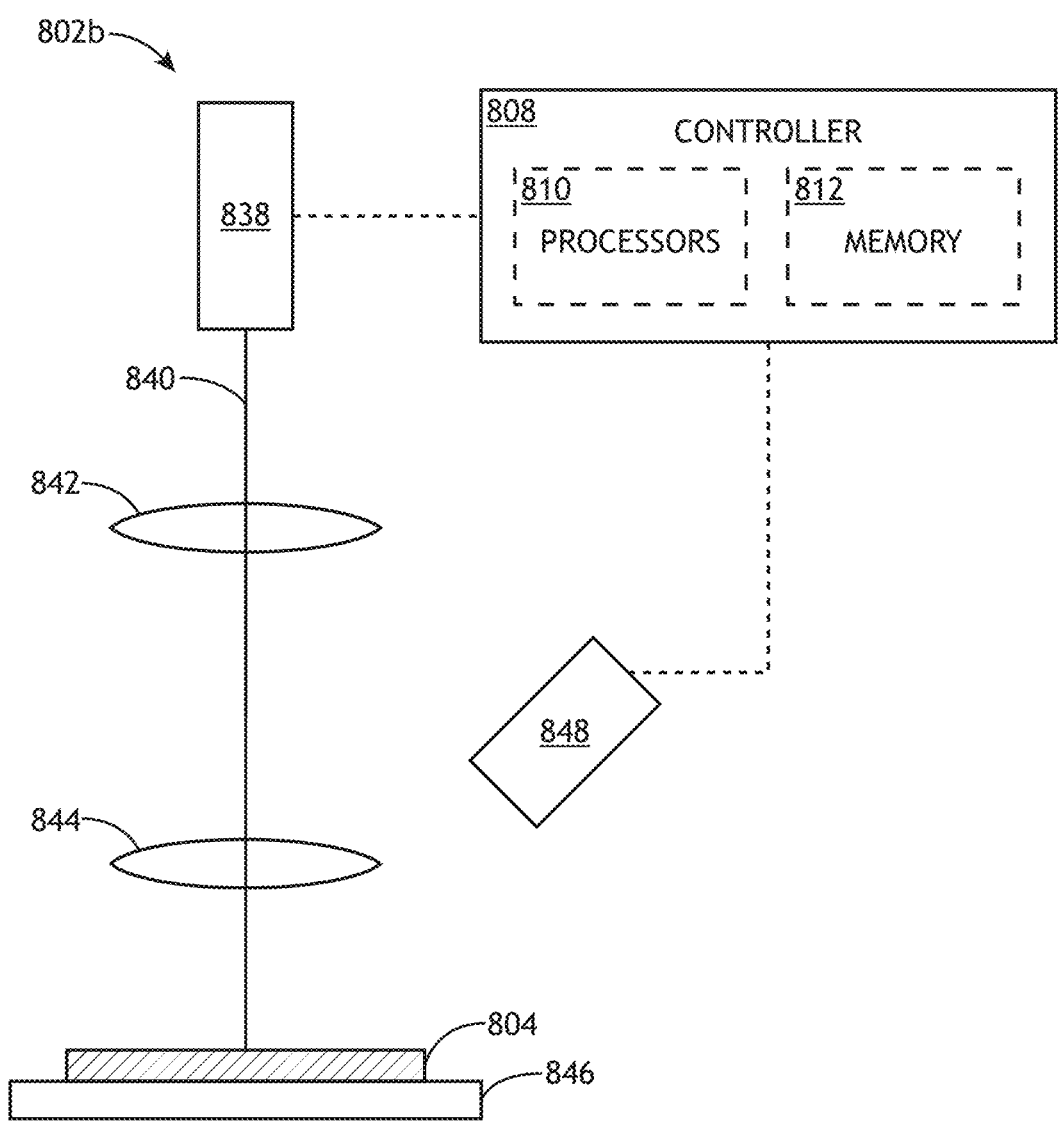
FIG. 8C illustrates a high-level schematic illustration of particle-beam metrology sub-system of the metrology system, according to some embodiments of the invention.

FIGS. 8A-8C illustrate a metrology system 800, in accordance with one or more embodiments of the present disclosure. The metrology system 800 may be configured to carry out any of the various embodiments described previously herein and may measure metrology parameters from any of the various metrology targets described herein. In one embodiment, the overlay metrology system 800 includes a metrology sub-system 802, or tool, suitable for generating overlay measurements and/or critical dimension measurements based on optically-resolvable features. In another embodiment, the sample 804 is disposed on a sample stage 806.

In another embodiment, the metrology system 800 includes a controller 808. The controller 808 may include one or more processors 810 configured to execute program instructions maintained on a memory medium 812. In this regard, the one or more processors 810 of controller 808 may execute any of the various process steps described throughout the present disclosure. For example, the controller 808 may receive data from any of the optical metrology sub-system 802*a* and may generate overlay correctables based on data from the optical metrology tool 802.

Further, the controller 808 may be communicatively coupled to one or more semiconductor process or fabrication tools 813 such as, but not limited to, a lithography tool. In this regard, the controller 808 may utilize the various outputs described previously herein to make adjustments to the process tool configuration, which in turn performs adjustments on one or more semiconductor wafers being fabricated on the fabrication line. For example, the controller 808 may operate as a process controller suitable for controlling the inputs of the process tool to maintain overlay in semiconductor devices fabrication on a fabrication line within selected overlay tolerances. The overlay correctables may be provided as part of a feedback and/or a feedforward control loop. In one embodiment, the overlay measurements associated with a current process step measured on a sample are used to compensate for drifts of one or more fabrication processes and may thus maintain overlay within selected tolerances across multiple exposures on subsequent samples in the same or different lots. In another embodiment, the overlay measurements associated with a current process step may be fed-forward to adjust subsequent process steps to compensate for any measured overlay errors. For example, the exposure of patterns on subsequent layers may be adjusted to match the measured overlay of the subsequent layers. In another embodiment, overlay measurements of a current process step may be fed-backward to the metrology system 800 itself to improve or enhance the metrology process on subsequent layers.

The one or more processors 810 of a controller 808 may include any processing element known in the art. In this sense, the one or more processors 810 may include any microprocessor-type device configured to execute algorithms and/or instructions. In one embodiment, the one or more processors 810 may consist of a desktop computer, mainframe computer system, workstation, image computer, parallel processor, or any other computer system (e.g., networked computer) configured to execute a program configured to operate the overlay metrology system 800, as described throughout the present disclosure. It is further recognized that the term "processor" may be broadly defined to encompass any device having one or more processing elements, which execute program instructions from a non-transitory memory medium 812. Further, the steps described throughout the present disclosure may be carried out by a single controller 808 or, alternatively, multiple controllers. Additionally, the controller 808 may include one or more controllers housed in a common housing or within multiple housings. In this way, any controller or combination of controllers may be separately packaged as a module suitable for integration into overlay metrology system 800.

The memory medium 812 may include any storage medium known in the art suitable for storing program instructions executable by the associated one or more processors 810. For example, the memory medium 812 may include a non-transitory memory medium. By way of another example, the memory medium 812 may include, but is not limited to, a read-only memory, a random-access memory, a magnetic or optical memory device (e.g., disk), a magnetic tape, a solid state drive, and the like. It is further noted that memory medium 812 may be housed in a common controller housing with the one or more processors 810. In one embodiment, the memory medium 812 may be located remotely with respect to the physical location of the one or more processors 810 and controller 808. For instance, the one or more processors 810 of controller 808 may access a remote memory (e.g., server), accessible through a network (e.g., internet, intranet, and the like). Therefore, the above description should not be interpreted as a limitation on the present invention but merely an illustration.

Referring now to FIG. 8B, in one embodiment, the metrology system 800 includes an optical metrology sub-system 802a. The optical metrology sub-system 802a, or tool, may include any type of optical overlay metrology tool known in the art suitable for generating overlay data associated with two or more layers of a sample such as, but not limited to, an image-based optical metrology tool or a scatterometry-based optical metrology tool.

In one embodiment, the optical metrology sub-system 802a includes an optical illumination source 814 to generate an optical illumination beam 816. The optical illumination beam 816 may include one or more selected wavelengths of light including, but not limited to, ultraviolet (UV) light, visible light, or infrared (IR) light. The optical illumination source 814 may include any type of illumination source suitable for providing an optical illumination beam 816. In one embodiment, the optical illumination source 814 is a laser source. For example, the optical illumination source 814 may include, but is not limited to, one or more narrow-band laser sources, a broadband laser source, a supercontinuum laser source, a white light laser source, or the like. In this regard, the optical illumination source 814 may provide an optical illumination beam 816 having high coherence (e.g., high spatial coherence and/or temporal coherence). In another embodiment, the optical illumination source 814 includes a laser-sustained plasma (LSP) source. For example, the optical illumination source 814 may include, but is not limited to, a LSP lamp, a LSP bulb, or a LSP chamber suitable for containing one or more elements that, when excited by a laser source into a plasma state, may emit broadband illumination. In another embodiment, the optical illumination source 814 includes a lamp source. For example, the optical illumination source 814 may include, but is not limited to, an arc lamp, a discharge lamp, an electrode-less lamp, or the like. In this regard, the optical illumination source 814 may provide an optical illumination beam 816 having low coherence (e.g., low spatial coherence and/or temporal coherence).

In another embodiment, the optical illumination source 814 directs the optical illumination beam 816 to the sample 804 via an illumination pathway 820. The illumination pathway 820 may include one or more illumination pathway lenses 822 or additional optical components 824 suitable for modifying and/or conditioning the optical illumination beam 816. For example, the one or more optical components 824 may include, but are not limited to, one or more polarizers, one or more filters, one or more beam splitters, one or more diffusers, one or more homogenizers, one or more apodizers, or one or more beam shapers. The illumination pathway 820 may further include an objective lens 826 configured to direct the optical illumination beam 816 to the sample 804.

In another embodiment, the sample 804 is disposed on a sample stage 828. The sample stage 828 may include any device suitable for positioning and/or scanning the sample 804 within the optical metrology sub-system 802a. For example, the sample stage 828 may include any combination of linear translation stages, rotational stages, tip/tilt stages, or the like.

In another embodiment, the optical metrology sub-system 802a includes a detector 830 configured to capture light emanating from the sample 804 through a collection pathway 832. The collection pathway 832 may include, but is not limited to, one or more collection pathway lenses 834 for collecting light from the sample 804. For example, a detector 830 may receive light reflected or scattered (e.g., via specular reflection, diffuse reflection, and the like) from the sample 804 via one or more collection pathway lenses 834. By way of another example, a detector 830 may receive light generated by the sample 804 (e.g., luminescence associated with absorption of the optical illumination beam 816 or the like). By way of another example, a detector 830 may receive one or more diffracted orders of light from the sample 804 (e.g., 0-order diffraction, ±1 order diffraction, ±2 order diffraction, and the like).

The detector 830 may include any type of detector known in the art suitable for measuring illumination received from the sample 804. For example, a detector 830 may include, but is not limited to, a CCD detector, a TDI detector, a photomultiplier tube (PMT), an avalanche photodiode (APD), or the like. In another embodiment, a detector 830 may include a spectroscopic detector suitable for identifying wavelengths of light emanating from the sample 804.

The collection pathway 832 may further include any number of optical elements to direct and/or modify collected illumination from the sample 804 including, but not limited to one or more collection pathway lenses 834, one or more filters, one or more polarizers, or one or more beam blocks.

In one embodiment, the detector 830 is positioned approximately normal to the surface of the sample 804. In another embodiment, the optical metrology sub-system 802a includes a beam splitter 836 oriented such that the objective lens 826 may simultaneously direct the optical illumination beam 816 to the sample 804 and collect light emanating from the sample 804. Further, the illumination pathway 820 and the collection pathway 832 may share one or more additional elements (e.g., objective lens 826, apertures, filters, or the like).

The optical metrology sub-system 802a may measure overlay based on any technique known in the art such as, but not limited to, imaged-based techniques or scatterometry-based techniques. For example, the optical metrology sub-system 802a operating in an imaging mode may illuminate a portion of the sample 804 and capture an image of the illuminated portion of the sample 804 on a detector 830. The captured image may be any type of image known in the art such as, but not limited to, a brightfield image, a darkfield image, a phase-contrast image, or the like. Further, captured images may be stitched together (e.g., by the optical metrology sub-system 802a, by the controller 808, or the like) to form a composite image of the sample 804. By way of another example, the optical metrology sub-system 802a may scan a focused optical illumination beam 816 across the sample 804 and capture light and/or particles emanating from the sample 804 on one or more detectors 830 at one or more measurement angles to generate an image pixel by pixel. Accordingly, overlay associated with two or more sample layers may be determined based on the relative positions of features located on the two or more sample layers.

By way of another example, the optical metrology sub-system 802a may operate as a scatterometry-based metrology tool by determining overlay based on the pattern of light scattered and/or diffracted from the sample 804 in response to the optical illumination beam 816. For example, optical metrology sub-system 802a may capture (e.g., with the detector 830) one or more pupil plane images (e.g., of different regions of an overlay target) including the angular distribution of light emanating from the sample. Accordingly, overlay between two or more sample layers may be determined from the pupil plane images based on modeled scattering and/or diffraction from overlay target features having known sizes and distributions for each layer.

Referring now to FIG. 8C, in one embodiment, the metrology system 800 includes a particle-beam metrology sub-system 802b. The particle-beam metrology sub-system 802b may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool).

In one embodiment, the particle-beam metrology sub-system 802b includes a particle source 838 (e.g., an electron beam source, an ion beam source, or the like) to generate a particle beam 840 (e.g., an electron beam, a particle beam, or the like). The particle source 838 may include any particle source known in the art suitable for generating a particle beam 840. For example, the particle source 838 may include, but is not limited to, an electron gun or an ion gun. In another embodiment, the particle source 838 is configured to provide a particle beam 840 with a tunable energy.

In another embodiment, the particle-beam metrology sub-system 802b includes one or more particle focusing elements 842. For example, the one or more particle focusing elements 842 may include, but are not limited to, a single particle focusing element or one or more particle focusing elements forming a compound system. In another embodiment, the one or more particle focusing elements 842 include a particle objective lens 844 configured to direct the particle beam 840 to the sample 804 located on a sample stage 846. Further, the one or more particle source 838 may include any type of electron lenses known in the art including, but not limited to, electrostatic, magnetic, uni-potential, or double-potential lenses.

In another embodiment, the particle-beam metrology sub-system 802b includes at least one particle detector 848 to image or otherwise detect particles emanating from the sample 804. In one embodiment, the particle detector 848 includes an electron collector (e.g., a secondary electron collector, a backscattered electron detector, or the like). In another embodiment, the particle detector 848 includes a photon detector (e.g., a photodetector, an x-ray detector, a scintillating element coupled to a photomultiplier tube (PMT) detector, or the like) for detecting electrons and/or photons from the sample surface.

It is to be understood that the description of a particle-beam metrology sub-system 802b as depicted in FIG. 8C and the associated descriptions above are provided solely for illustrative purposes and should not be interpreted as limiting. For example, the particle-beam metrology sub-system 802b may include a multi-beam and/or a multi-column system suitable for simultaneously interrogating a sample 804. In a further embodiment, the particle-beam metrology sub-system 802b may include one or more components (e.g., one or more electrodes) configured to apply one or more voltages to one or more locations of the sample 804. In this regard, the particle-beam metrology sub-system 802b may generate voltage contrast imaging data.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology measurement method comprising:
    measuring a metrology target, wherein the metrology target comprises at least:
        a first layer including a first periodic structure along a measurement direction,
        a second layer including a second periodic structure along the measurement direction, and
        a third layer including a third periodic structure along a second direction orthogonal to the measurement direction,
        wherein the first layer overlaps the second layer and the third layer,
        wherein the third layer overlaps the second layer,
        wherein the third layer is between the first layer and the second layer; and
    identifying and removing a signal component related to the third periodic structure to reduce noise in a signal derived by the metrology target measurement.

2. The metrology measurement method of claim 1, further comprising deriving multiple slices from the signal derived by the metrology target measurement, the slices corresponding to properties of the third periodic structure.

3. The metrology measurement method of claim 2, further comprising averaging the multiple slices to yield a metrology signal.

4. The metrology measurement method of claim 2, further comprising selecting an optimal slice signal by comparing the multiple slices with respect to at least one accuracy parameter.

5. The metrology measurement method of claim 4, further comprising reiterating the selection for at least one of consecutive targets, wafers, or batches.

6. The metrology measurement method of claim 4, further comprising improving a metrology robustness by tracking a spatial behavior thereof and the optimal slice.

7. The metrology measurement method of claim 1, further comprising calibrating measurement coordinates using the third periodic structure by comparing camera and beam axes.

8. The metrology measurement method of claim 1, further comprising deriving at least one of focus information or harmonic components of a signal measured from the third periodic structure.

9. The metrology measurement method of claim 1, further comprising applying one or more machine learning algorithms to analyze a signal measured from the third periodic structure and deriving information from data associated with the second direction orthogonal to the measurement direction.

10. The metrology measurement method of claim 1, wherein the metrology target comprises at least one of an imaging metrology target or a scatterometry metrology target.

11. The metrology measurement method of claim 10, wherein the imaging target has at least two pairs of periodic structures, at least one pair thereof along each of two measurement directions.

12. The metrology measurement method of claim 1, wherein the metrology target comprises a pupil plane scatterometry metrology target, wherein the method comprises measuring the metrology target in a plurality of locations within the metrology target and extracting a metrology metric with enhanced accuracy from a plurality of measurements.

13. The metrology measurement method of claim 1, wherein the third periodic structure comprises at least one of a uniform critical dimension, a monotonic changing critical dimension, a periodically monotonic changing critical dimension, or two or more periodic sub-structures.

14. The metrology measurement method of claim 1, wherein the method is carried out at least partially by at least one computer processor.

15. A system comprising:
    a controller including one or more processors and memory, the memory storing program instructions configured to cause the one or more processors to:
        receive one or more measurements of a metrology target, wherein the metrology target comprises:
            a first layer including a first periodic structure along a measurement direction,
            a second layer including a second periodic structure along the measurement direction, and
            a third layer including a third periodic structure along a second direction orthogonal to the measurement direction,
            wherein the first layer overlaps the second layer and the third layer,
            wherein the third layer overlaps the second layer,
            wherein the third layer is between the first layer and the second layer;
        identify and remove a signal component related to the third periodic structure to reduce noise in a signal derived from the one or more measurements; and
        determine one or more metrology metrics based on the received one or more measurements.

16. The system of claim 15, wherein the one or more processors are further configured to derive a plurality of slices from a signal derived from the one or more measurements, the slices corresponding to properties of the third periodic structure.

17. The system of claim 16, wherein the one or more processors are further configured to average the plurality of slices to yield a metrology signal.

18. The system of claim 15, wherein the one or more processors are further configured to calibrate one or more measurement coordinates using the third periodic structure by comparing camera and beam axes.

19. The system of claim 15, wherein the one or more processors are further configured to derive at least one of focus information or harmonic components of a signal measured from the third periodic structure.

20. The system of claim 15, wherein the one or more processors are further configured to apply one or more machine learning algorithms to analyze a signal measured from the third periodic structure and deriving information from data associated with the second direction orthogonal to the measurement direction.

21. The system of claim 15, wherein the metrology target comprises at least one of an imaging metrology target or a scatterometry metrology target.

22. The system of claim 21, wherein the imaging target has at least two pairs of periodic structures, at least one pair thereof along each of two measurement directions.

23. The system of claim 15, wherein the metrology target comprises a pupil plane scatterometry metrology target, wherein the one or more measurements are acquired in a plurality of locations within the metrology target, wherein the one or more processors are further configured to extract a metrology metric with enhanced accuracy from a plurality of measurements.

24. The system of claim 15, wherein the third periodic structure comprises at least one of a uniform critical dimension, a monotonic changing critical dimension, a periodically monotonic changing critical dimension, or two or more periodic sub-structures.

25. The metrology target of claim 15, wherein the metrology target is configured as at least one of an imaging target or a scatterometry target.

26. The metrology target of claim 25, wherein the metrology target is configured as the imaging target having at least two pairs of periodic structures, at least one pair thereof along each of two measurement directions.

27. The metrology target claim 15, wherein the third periodic structure comprises at least one of a uniform critical dimension, a monotonic changing critical dimension, a periodically monotonic changing critical dimension, or two or more periodic sub-structures.

28. The metrology target of claim 15, wherein the third periodic structure is process compatible.

29. The metrology target of claim 28, wherein the process compatibility comprises at least one of segmentation of elements of the third periodic structure, uniform critical dimension of segments of elements of the third periodic structure, or an application of a cut mask with uniform or variable critical dimension.

* * * * *